(12) United States Patent
Josselson et al.

(10) Patent No.: US 7,218,697 B2
(45) Date of Patent: May 15, 2007

(54) DIGITAL PHASE DETECTOR FOR PERIODICALLY ALTERNATING SIGNALS

(75) Inventors: Robert H. Josselson, Fort Wayne, IN (US); Lester G. Matheson, Albian, IN (US); David G. Cordray, Columbia City, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 724 days.

(21) Appl. No.: 10/721,942

(22) Filed: Nov. 25, 2003

(65) Prior Publication Data

US 2005/0111606 A1    May 26, 2005

(51) Int. Cl.
*H03D 3/24*    (2006.01)
*H03L 7/06*    (2006.01)
(52) U.S. Cl. ...................... 375/375; 327/156
(58) Field of Classification Search ............... 375/144, 375/375, 376; 327/156; 398/39, 150; 356/603; 342/25 C
See application file for complete search history.

(56) References Cited

U.S. PATENT DOCUMENTS

| | | | |
|---|---|---|---|
| 4,001,682 A | 1/1977 | Watt | |
| 4,178,631 A | 12/1979 | Nelson, Jr. | |
| 4,345,838 A | 8/1982 | Buijs et al. | |
| 5,084,669 A | 1/1992 | Dent | |
| 5,333,047 A | 7/1994 | Toyama et al. | |
| 5,461,643 A | 10/1995 | LaRosa et al. | |
| 5,517,307 A | 5/1996 | Buehring et al. | |
| 5,572,550 A * | 11/1996 | Park | 375/326 |
| 5,663,666 A | 9/1997 | Chu et al. | |
| 5,732,109 A | 3/1998 | Takahashi | |
| 5,978,084 A | 11/1999 | Blake et al. | |
| 6,051,996 A | 4/2000 | Myer | |
| 6,124,931 A | 9/2000 | Hill | |
| 6,148,050 A | 11/2000 | Holmqvist | |
| 6,236,278 B1 * | 5/2001 | Olgaard | 331/25 |
| 6,288,574 B1 | 9/2001 | Neary | |
| 2004/0105100 A1 * | 6/2004 | Shirley | 356/603 |

* cited by examiner

*Primary Examiner*—Emmanuel Bayard
*Assistant Examiner*—Lawrence B. Williams
(74) *Attorney, Agent, or Firm*—RatnerPrestia

(57) ABSTRACT

A method of determining a phase between a first signal and a second signal is provided. The first signal and the second signal correspond to signal transmissions between a first device and a second device. The second device periodically moves along a translational axis with respect to the first device in a first direction or a second direction. The method includes assigning a positive or negative value to each of a plurality of positive and negative zero crossings of the first signal. The method also includes counting a numerator and a denominator counter for a predetermined interval. The method also includes calculating a raw phase between the first signal and the second signal by dividing a value of the numerator by a corresponding value of the denominator after the predetermined interval.

22 Claims, 12 Drawing Sheets

DIGITAL PHASE DETECTOR FOR PERIODICALLY ALTERNATING SIGNALS

FIELD OF THE INVENTION

This invention relates to a phase detector for periodically alternating signals, and more particularly, to a digital phase detector.

BACKGROUND OF THE INVENTION

Interferometers often utilize metrology signals that alternate sign as a moving arm (i.e., the porch swing) changes direction of motion. The moving arm creates an optical path difference; however, mechanical tilt about a rotative axis and/or mechanical tip about another rotative axis may be created as the moving arm moves back and forth. Two signals may be generated whose phase difference is proportional to the tilt (and/or tip). One of the signals (e.g., R) is known as the reference signal. The other signal (e.g., X), because of its physical relationship to the reference signal, changes phase sign each time the moving arm changes direction.

In certain interferometer systems, a dynamic alignment mechanism is is provided to compensate for the tilt and tip, for example, by counteracting the angular motion of the moving arm. Unfortunately, conventional phase detectors operate with signals whose phase does not periodically alternate sign. This is undesirable in certain interferometer applications that include the alternating sign metrology signal.

Attempts have been made to design interferometer systems that utilize a dynamic alignment control unit to determine the direction of the moving arm. This direction may then be input to an analog phase comparator. The analog phase comparator reverses the sign of its output each time the moving arm changes direction. As such, the output of the analog phase comparator may be considered to be proportional to the tilt (or tip) of the moving arm, and as such, it may be used as feedback to a servomechanism or the like.

Unfortunately, these attempts have not produced a phase detector that can accommodate a desired range of periodically alternating phase signals. For example, certain interferometer systems include an analog phase comparator with a limited range of ±120°. Further, these design attempts have not provided for an explicit signal that represents cavity tilt (i.e., the total tilt between the two arms of the interferometer).

Accordingly, it would be desirable to provide a more effective phase detector for use with periodically alternating signals to overcome one or more of the above-recited deficiencies.

SUMMARY OF THE INVENTION

According to an exemplary embodiment of the present invention, a method of determining a phase between a first signal and a second signal is provided. The first signal and the second signal correspond to signal transmissions between a first device and a second device. The second device periodically moves along a translational axis with respect to the first device in a first direction or a second direction. The method includes assigning a positive or negative value to each of a plurality of positive and negative zero crossings of the first signal. A positive zero crossing is assigned a positive value if the second signal is negative or a negative value if the second signal is positive. A negative zero crossing is assigned a positive value if the second signal is positive or a negative value if the second signal is negative. The method also includes counting a numerator for a predetermined interval. The numerator is counted in a positive direction (i.e., counted up) if the second device is moving in the first direction and the value assigned to a corresponding zero crossing of the first signal is negative or if the second device is moving in the second direction and the value assigned to the corresponding zero crossing is positive. The numerator is counted in a negative direction (i.e., counted down) if the second device is moving in the first direction and the value assigned to the corresponding zero crossing is positive or if the second device is moving in the second direction and the value assigned to the corresponding zero crossing is negative. The method also includes counting a denominator for the predetermined interval. The denominator is counted in a positive direction. The method also includes calculating a raw phase between the first signal and the second signal by dividing a value of the numerator by a corresponding value of the denominator after the predetermined interval.

According to another exemplary embodiment of the present invention, a digital phase detector for determining a phase between a first signal and a second signal is provided. The first signal and the second signal correspond to signal transmissions between a first device and a second device. The second device periodically moves along a translational axis with respect to the first device in a first direction or a second direction. The digital phase detector includes a polarity determiner for assigning a positive or negative value to each of a plurality of positive and negative zero crossings of the first signal. The polarity determiner assigns a positive zero crossing a positive value if the second signal is negative or a negative value if the second signal is positive. The polarity determiner assigns a negative zero crossing a positive value if the second signal is positive or a negative value if the second signal is negative. The digital phase detector also includes a numerator counter for counting for a predetermined interval. The numerator counter counts in a positive direction (i.e., counts up) if the second device is moving in the first direction and the value assigned to a corresponding zero crossing of the first signal is negative or if the second device is moving in the second direction and the value assigned to the corresponding zero crossing is positive. The numerator counter counts in a negative direction (i.e., counts down) if the second device is moving in the first direction and the value assigned to the corresponding zero crossing is positive or if the second device is moving in the second direction and the value assigned to the corresponding zero crossing is negative. The digital phase detector also includes a denominator counter for counting in a positive direction for the predetermined interval. Additionally, the digital phase detector includes a raw phase calculator for calculating a raw phase between the first signal and the second signal by dividing a value of the numerator counter by a corresponding value of the denominator counter after the predetermined interval.

BRIEF DESCRIPTION OF THE DRAWINGS

Exemplary embodiments of the invention will be described with reference to the drawings, of which.

DETAILED DESCRIPTION OF THE INVENTION

Preferred features of embodiments of this invention will now be described with reference to the figures. It will be appreciated that the spirit and scope of the invention is not limited to the embodiments selected for illustration. Also, it should be noted that the drawings are not rendered to any particular scale or proportion. It is contemplated that any of the configurations and materials described hereafter can be modified within the scope of this invention.

As used herein, the terms tilt and tip refer to a relative position along one of a number of rotative axes. As such, these terms are not intended to be limited to positions about specific rotative axes, but rather are illustrative of a relative position about any of a number of rotative axes.

As opposed to the prior art, which provided incremental cavity tilt, certain embodiments of the present invention provide absolute tilt, which is used as feedback for a dynamic alignment mechanism controller, and is further used by a tilt correction algorithm for the output spectra of the interferometer.

The present invention is related to a phase detector for use with interferometer systems. For example, such systems may include a reference device (e.g., a reference mirror) and a moving device (e.g., a moving mirror). When the moving device moves back and forth (e.g., along a translational axis), some level of "tilt" may be introduced. For example, the moving device is tilted with respect to the reference device. As such, it may be desirable to determine the tilt of the moving device so that the reference device can be compensated for (e.g., tilted similar to the moving device).

In certain interferometer applications, as the moving device translates it induces a small line of sight rotational motion (e.g., tilt, tip, etc.) that is corrected for by the changes to the reference device. As explained herein, this correction is based on a detected phase between first and second signals (i.e., R and X), where the detected phase is proportional to the induced rotation.

The size of the detected phase is related to the magnitude of the tilt of the moving device as it translates. Further, the detected phase alternates because of the moving device alternating directions.

Figure 1:
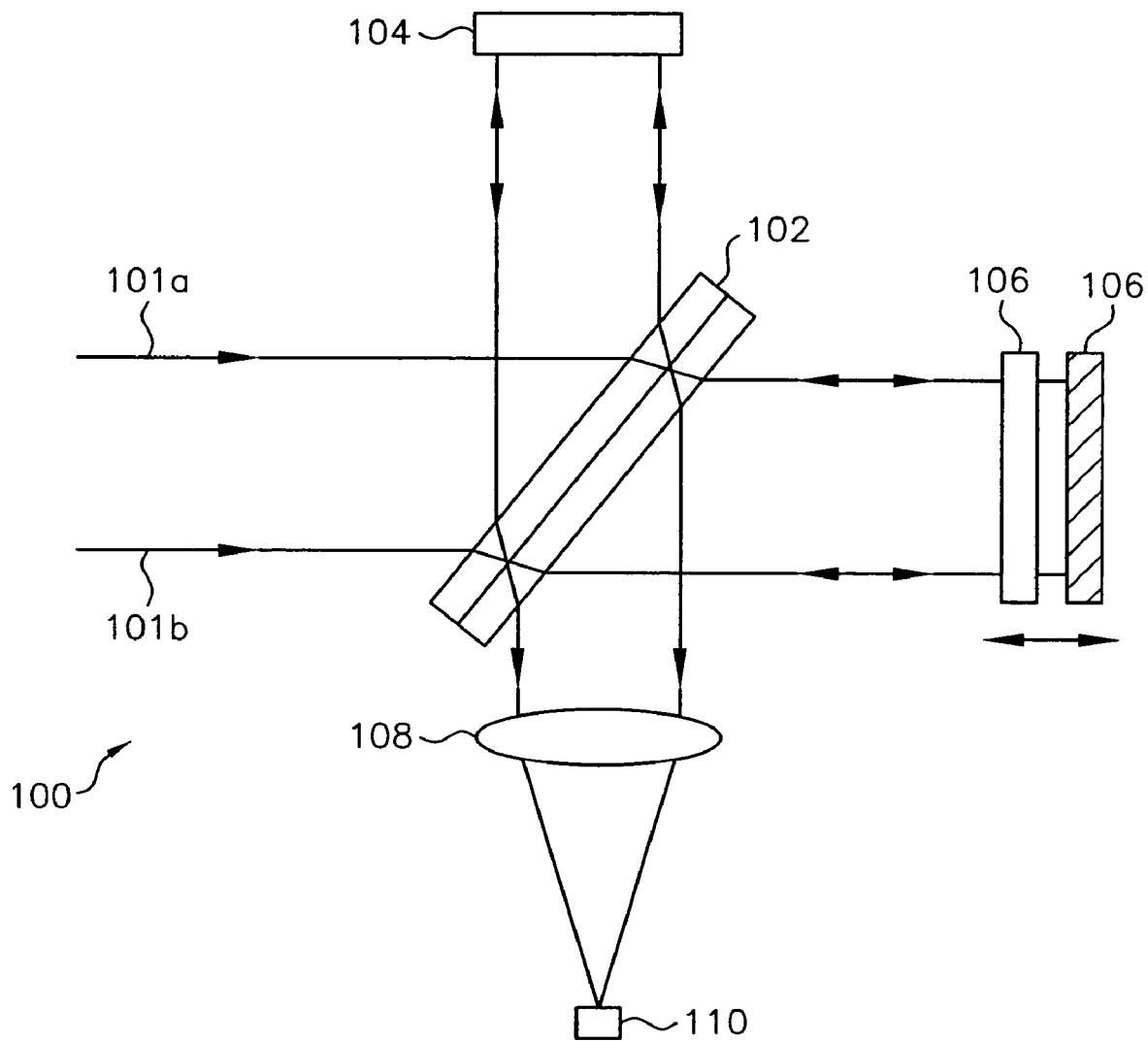
FIG. 1 is a block diagram illustration of a portion of an interferometer system in connection with an exemplary embodiment of the present invention.

FIG. 1 is a block diagram of various components of an interferometer system 100 (e.g., a Michelson interferometer system). Input light beams 101a and 101b are transmitted to beam splitter 102. A portion of the light transmitted to beam splitter 102 reflects off of beam splitter 102 and is transmitted to reference mirror 104. This light reflects from reference mirror 104 back to beam splitter 102, and subsequently through beam splitter 102 into focusing optics 108. Light also passes through beam splitter 102 in refraction to moving mirror 106, back to a back surface of beam splitter 102, and then reflected into focusing optics 108. Moving mirror 106 is shown two times in FIG. 1 to illustrate motion along a translational axis.

Light (e.g., in two beams) is transmitted from focusing optics 108 to detector 110. Detector 110 receives, for example, two light beams interfering with one another, and detector 110 sets up an interference pattern (e.g., an interferogram relating intensity to mirror position). Although detector 110 is shown as a single detector, it may be a number of detectors, for example, two detectors (e.g., one detector for the R signal and another detector for the X signal).

Figure 2A:
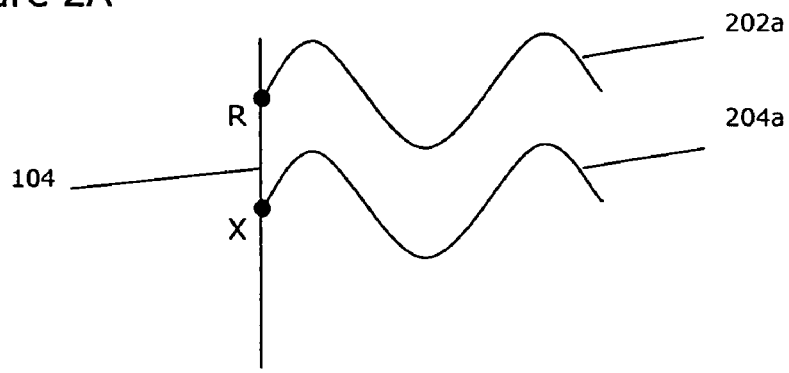
FIG. 2A is a graphical illustration of two signals in accordance with an exemplary embodiment of the present invention.
Figure 2B:
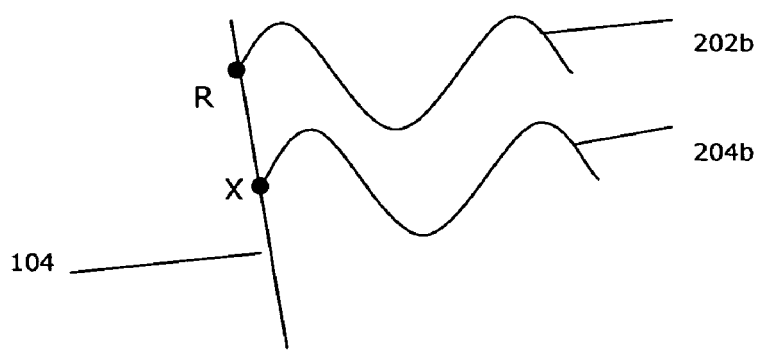
FIG. 2B is another graphical illustration of two signals in accordance with an exemplary embodiment of the present invention.
Figure 2C:
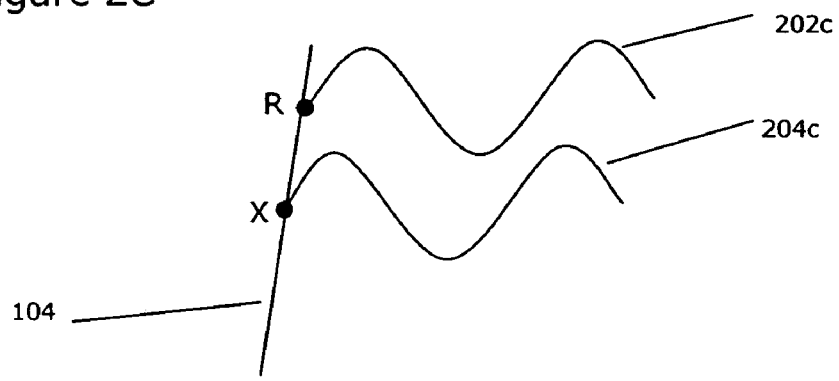
FIG. 2C is yet another graphical illustration of two signals in accordance with an exemplary embodiment of the present invention.

FIG. 2A is a graphical illustration of two signals R and X, as described with reference to FIG. 1. In FIG. 2A signals R and X are shown in relation to reference mirror 104. Signal R is represented by curve 202a, and signal X is represented by curve 204a. As shown in FIG. 2A, signal R and signal X are essentially in phase with one another, and as such, reference mirror 104 and moving mirror 106 (not shown in FIGS. 2A–2C) are not "tilted" with respect to one another. In FIG. 2B, reference mirror 104 is tilted with respect to moving mirror 106, and as such, signal X (represented by curve 204b) is leading with respect to signal R (represented by curve 202b). In FIG. 2C, reference mirror 104 is tilted with respect to moving mirror 106 (in a direction opposite the tilting represented in FIG. 2B), and as such, signal X (represented by curve 204c) is lagging with respect to signal R (represented by curve 202c).

Figure 3:
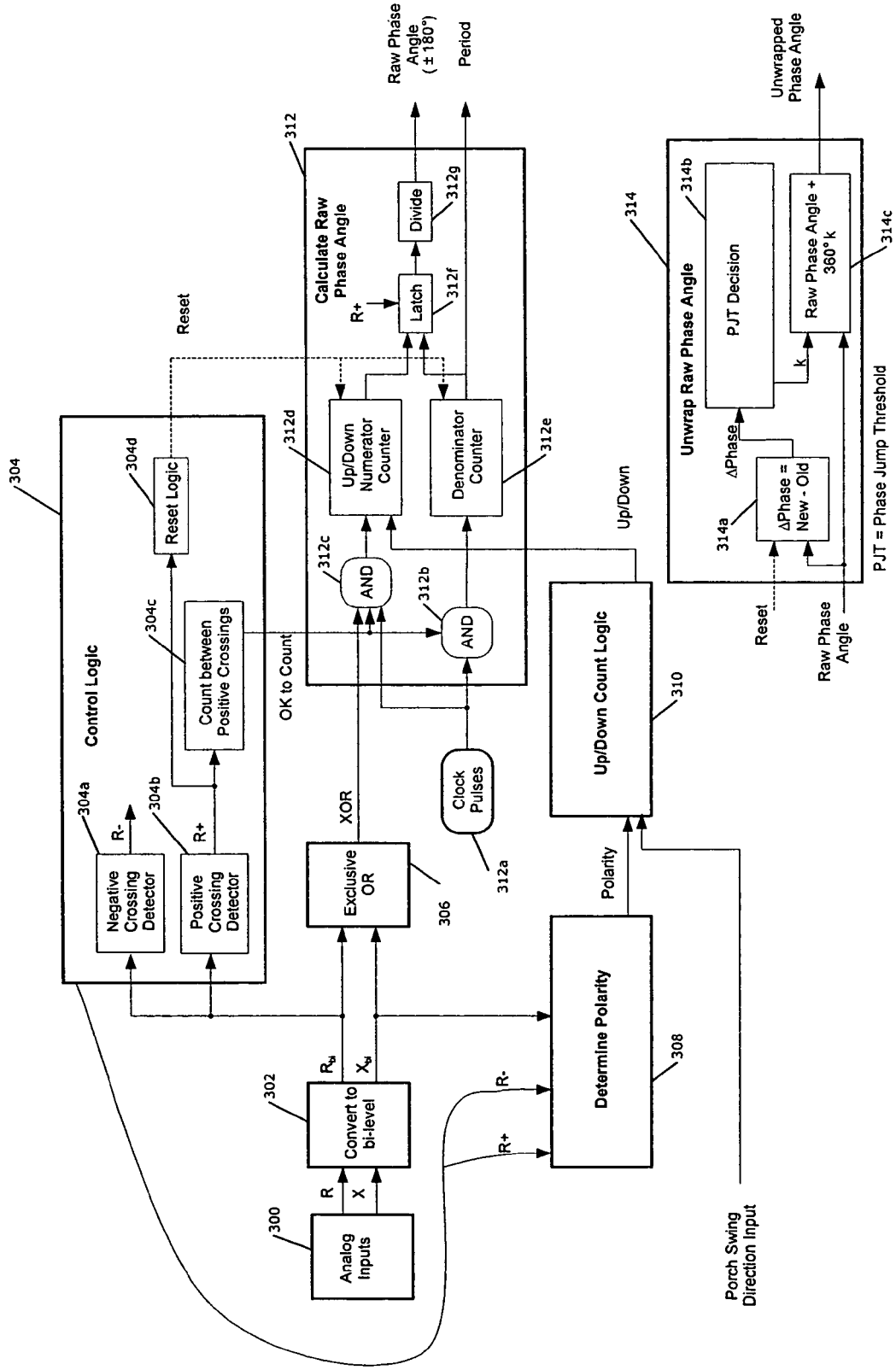
FIG. 3 is a block diagram of a digital phase detector in accordance with an exemplary embodiment of the present invention.

Through the various exemplary embodiments described herein, tilting of a reference mirror with respect to a moving mirror can be compensated for using a digital phase detector according to the present invention. FIG. 3 is a block diagram overview of a sign compensated digital phase detection system. Various aspects of the digital phase detection system illustrated in FIG. 3 are described in terms of their respective functions; however, it is contemplated that these aspects of the present invention may be accomplished through hardware, software, or a combination thereof.

Analog input function 300 provides analog inputs R and X to Convert to bi-level function 302 which provides outputs $R_{bi}$ and $X_{bi}$. Convert to bi-level function 302 digitizes analog inputs R and X for digital processing, thereby producing outputs $R_{bi}$ and $X_{bi}$. As detailed below, $R_{bi}$ signal is transmitted to Control Logic function 304, $R_{bi}$ and $X_{bi}$ signals are transmitted to Exclusive OR function 306, and $X_{bi}$ signal is transmitted to Determine Polarity function 308. As detailed below, Control Logic function 304 (including Negative Crossing Detector 304a, Positive Crossing Detector 304b, Count Between Positive Crossings function 304c, and Reset Logic function 304d) is responsible for detecting positive and negative zero crossings of $R_{bi}$ signal, for providing counting signals for counting between positive zero crossings, and for providing reset signals for numerator and denominator counters. Exclusive OR function 306 determines when either, but not both, of $R_{bi}$ and $X_{bi}$ signals is positive. Determine Polarity function 308 is responsible for assigning a polarity to each zero crossing of the $R_{bi}$ signal.

$R_{bi}$ signal is transmitted to Negative Crossing Detector 304a and Positive Crossing Detector 304b in Control Logic function 304. From Negative Crossing Detector 304a and Positive Crossing Detector 304b, R− and R+ signals are generated respectively. R+ signals are sent to Count Between Positive Crossings function 304c and Reset Logic function 304d. Output data (i.e., R− and R+) from Negative Crossing Detector 304a and Positive Crossing Detector 304b is transmitted to Determine Polarity function 308. Output data from Count Between Positive Crossings function 304c is provided to AND function 312b and AND function 312c in Calculate Raw Phase Angle function 312. Output signals from Reset Logic function 304d are transmitted to Up/Down Numerator Counter 312d and Denominator Counter 312e of Calculate Raw Phase Angle function 312.

As provided above, $R_{bi}$ and $X_{bi}$ signals from Convert to bi-level function 302 are transmitted to Exclusive OR function 306, and output from Exclusive OR function 306 is provided to AND function 312c of Calculate Raw Phase Angle function 312. Additionally, clock pulses from Clock Pulse function 312a are transmitted to AND function 312b and AND function 312c of Calculate Raw Phase Angle function 312.

Output signals from Determine Polarity function 308, as well as Porch Swing Direction Input data, are transmitted to Up/Down Count Logic function 310. Output from Up/Down Count Logic function 310 is transmitted to Up/Down Numerator Counter 312d of Calculate Raw Phase Angle function 312.

With respect to Calculate Raw Phase Angle function 312, AND function 312c receives data from Count Between Positive Crossings function 304c, Exclusive OR function 306, and Clock Pulse function 312a. Output from AND function 312c is transmitted to Up/Down Numerator Counter 312d. Up/Down Numerator Counter 312d also receives data from Up/Down Count Logic Function 310 indicative of the direction in which Up/Down Numerator Counter 312d is to be counted.

As detailed herein, Calculate Raw Phase Angle function 312 calculates a raw phase angle between signals $R_{bi}$ and $X_{bi}$, or between signals R and X. Calculate Raw Phase Angle function 312 utilizes AND function 312b and AND function 312c (e.g., AND gates, or software having AND gate logic), both of which provide positive (i.e., high) signals when each of their respective inputs are positive/true. The positive (i.e., high) output signals are provided to Up/Down Numerator Counter 312d and Denominator Counter 312e, thereby enabling the Counters 312d and 312e.

Up/Down Numerator Counter 312d counts a numerator value for a predetermined period and then transmits the counted value to Latch function 312f. After the predetermined interval, Up/Down Numerator Counter 312d is reset using a reset signal transmitted from Reset Logic function 304d.

Again with respect to Calculate Raw Phase Angle function 312, AND function 312b receives data from Count Between Positive Crossings function 304c and Clock Pulse function 312a. Output from AND function 312b is transmitted to Denominator Counter 312e.

Denominator Counter 312e counts a denominator value for a predetermined period and then transmits the counted value to Latch function 312f. After the predetermined interval, Denominator Counter 312e is reset using a reset signal transmitted from Reset Logic function 304d.

Latch function 312f "latches" the current values of each of the numerator and denominator at the end of the predetermined period. The counted numerator value from Up/Down Numerator Counter 312d and the counted denominator value from Denominator Counter 312e are sent from Latch function 312f to Divide function 312g. Divide function 312g divides the latched numerator value by the latched denominator value. The output from Divide function 312g is a raw phase angle which is transmitted, along with period interval data from Denominator Counter 312e, to Unwrap Raw Phase Angle function 314.

Unwrap Raw Phase Angle function 314 includes ΔPhase function 314a, where the present raw phase angle is subtracted from the previous raw phase angle. The resultant ΔPhase value is transmitted to PIT Decision function 314b. PIT Decision function 314b determines if the raw phase angle has made a large change in value between subsequent time samples. The output from PIT Decision function 314b, along with the raw phase angle from Divide function 312g, are provided to Raw Phase Angle +360° k. function 314c. The output of Raw Phase Angle +360° k. function 314c is the desired Unwrapped Phase value.

Details of various functions and processes described above with respect to FIG. 3 will now be described by reference to the examples provided in FIGS. 4–11.

Figure 4:
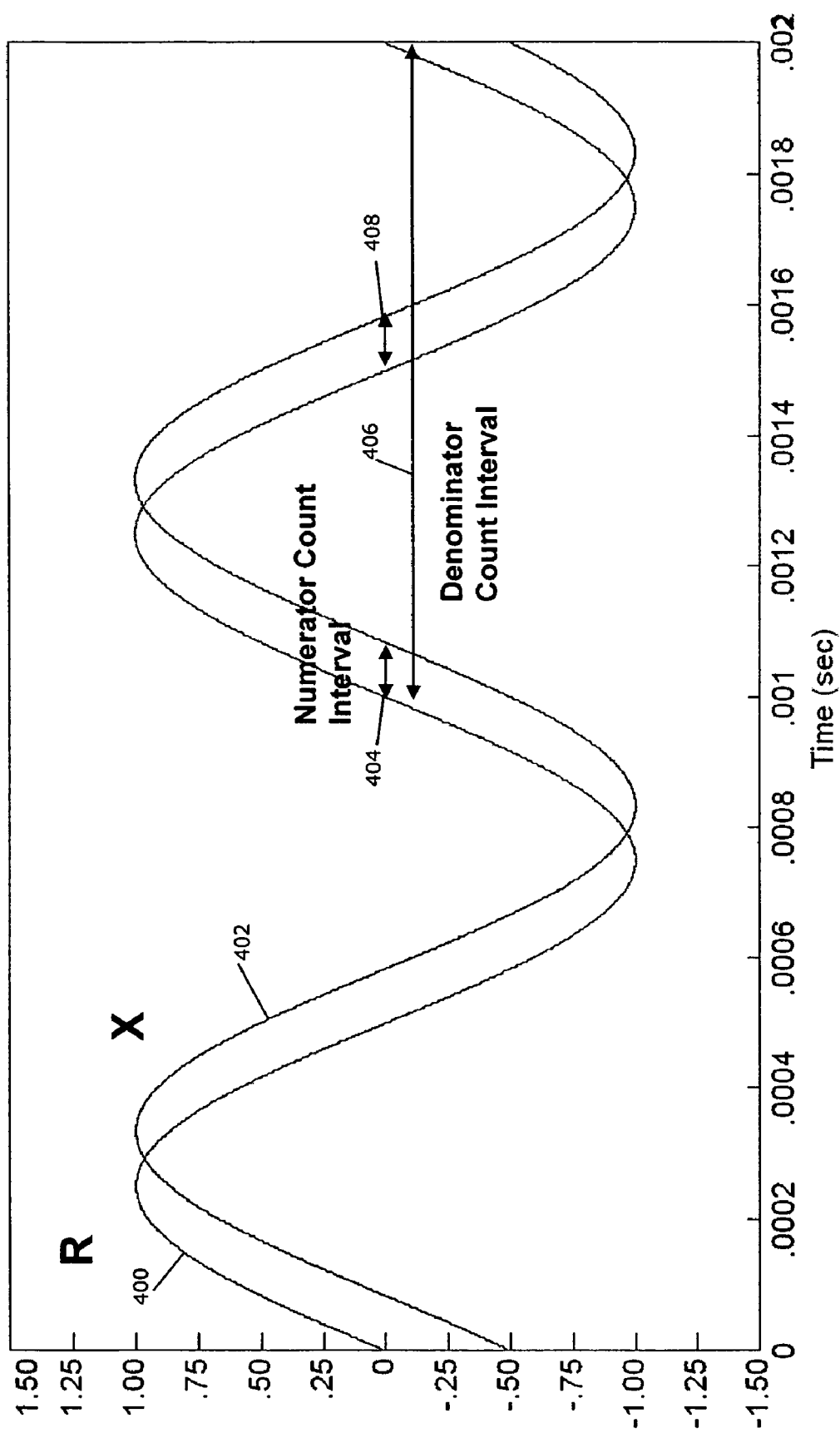
FIG. 4 is a graphical illustration related to a portion of a method of determining a phase between a first and a second signal in accordance with an exemplary embodiment of the present invention.

FIG. 4 is a graphical illustration of exemplary analog inputs R and X provided by Analog input function 300. R curve 400 represents the analog reference signal. X curve 402 represents the analog signal that relates to tilt. The phase difference between R and X in this example is approximately −30°, and as illustrated, X lags R. The plot tracks amplitude of each of the signals (Y-axis) as a function of time (X-axis). In the exemplary embodiment illustrated in FIG. 4, Up/Down Numerator Counter 312d counter counts (e.g., using clock pulses using, for example, a 50 MHz clock) between positive zero crossings of R and X (i.e., during numerator count interval 404) and between negative zero crossings of R and X (i.e., during numerator count interval 408). Denominator Counter 312e counts clock pulses between subsequent positive zero crossings of R (i.e., during denominator count interval 406). The ratio of the value of Up/Down Numerator Counter 312d to the value of Denominator Counter 312e during a predetermined interval (e.g., one period) is proportional to the phase angle between R and X.

Figure 5:
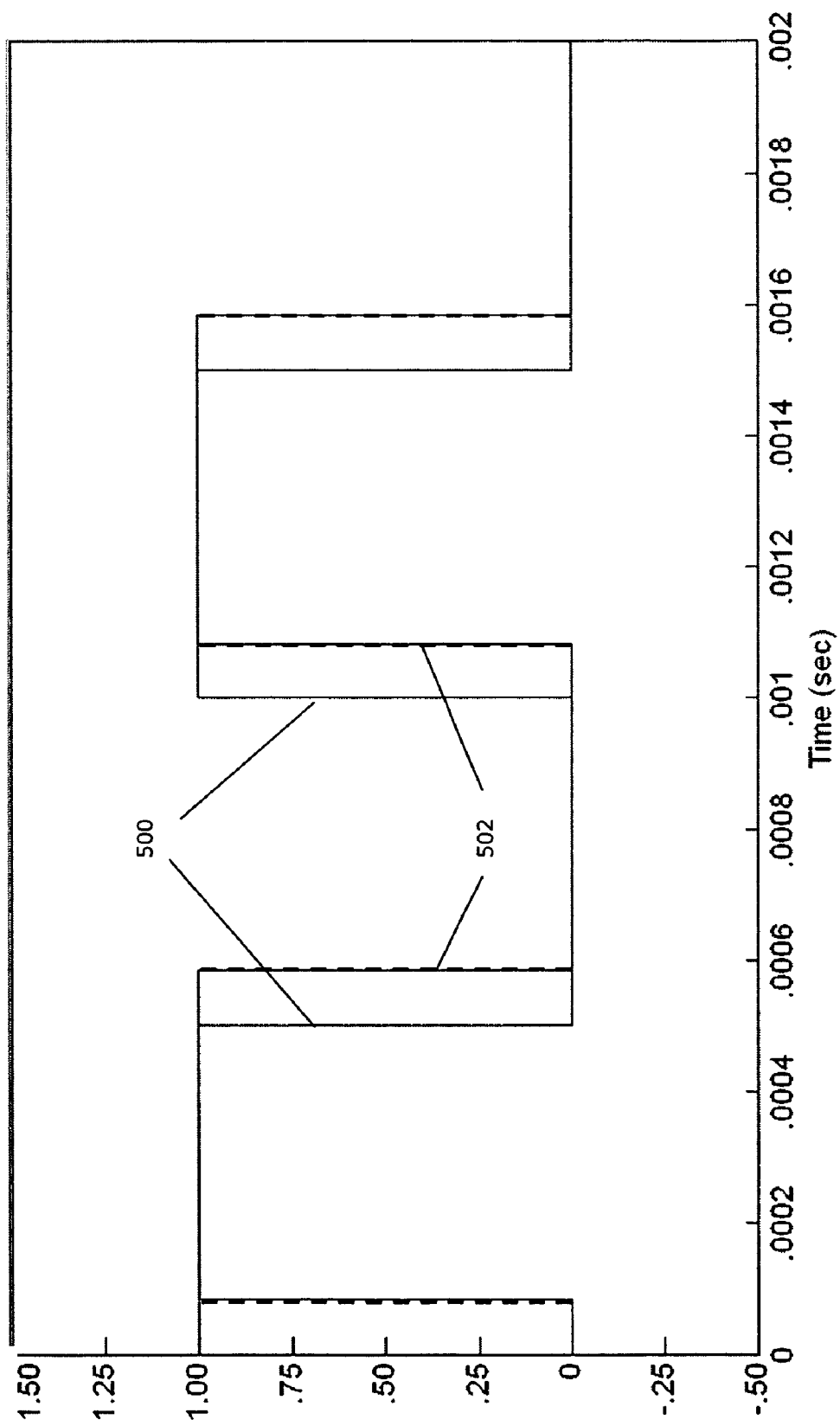
FIG. 5 is a graphical illustration related to another portion of a method of determining a phase between a first and a second signal in accordance with an exemplary embodiment of the present invention.

FIG. 5 is a graphical illustration of signals R and X after being processed by Convert to bi-level function 302, thereby providing outputs $R_{bi}$ and $X_{bi}$. R and X are converted to bi-level signals for digital processing. Convert to bi-level function 302 operates such that if R>0, then $R_{bi}$=+1, and if R<0, then $R_{bi}$=0. Convert to bi-level function 302 operates similarly for X. In FIG. 5, $R_{bi}$ is represented by signal 500, and $X_{bi}$ is represented by signal 502 (partially hatched for clarity).

Figure 6:
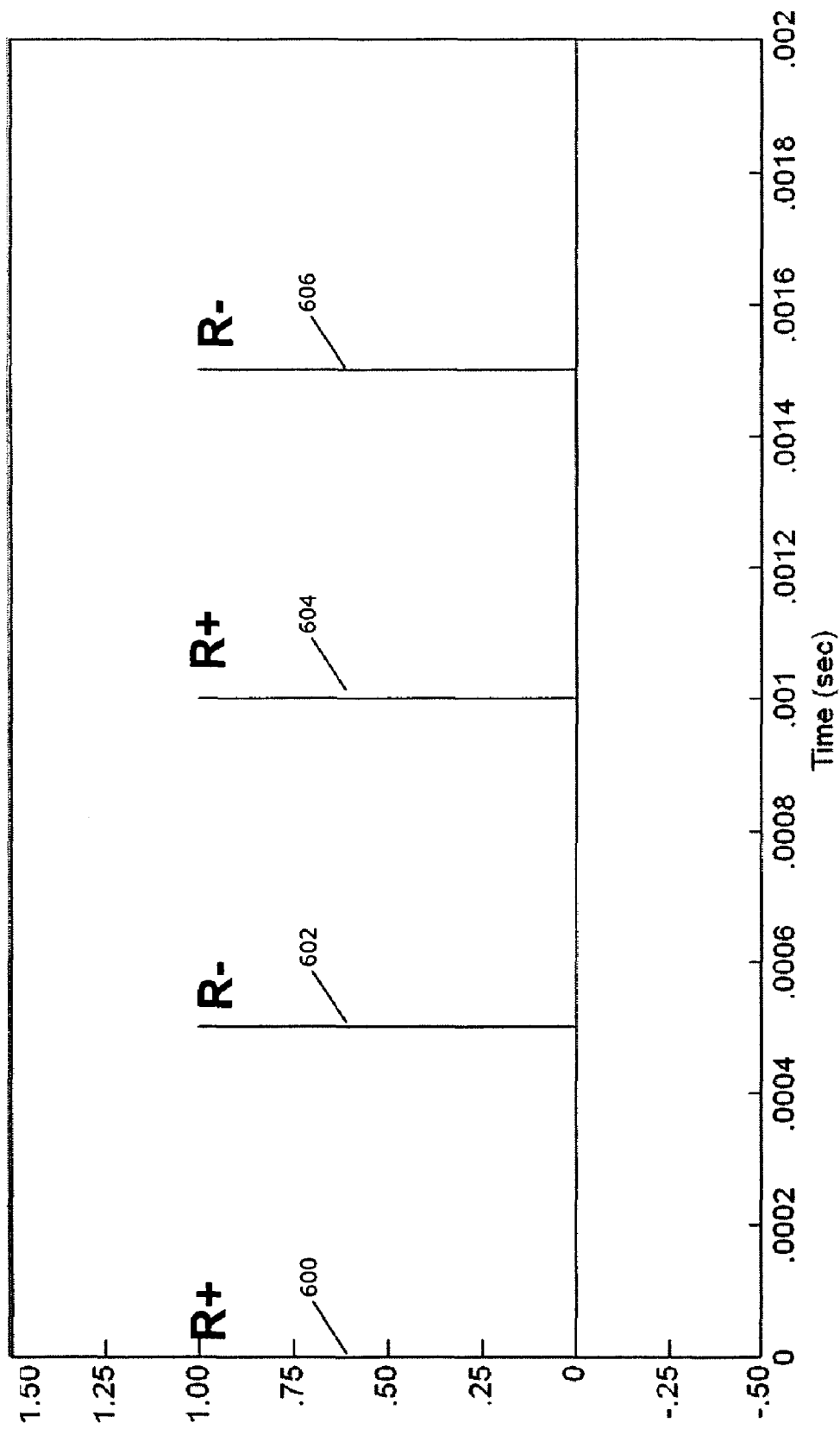
FIG. 6 is a graphical illustration related to yet another portion of a method of determining a phase between a first and a second signal in accordance with an exemplary embodiment of the present invention.

FIG. 6 is a graphical illustration related to Control Logic function 304 including Negative Crossing Detector 304a and Positive Crossing Detector 304b. Negative Crossing Detector 304a and Positive Crossing Detector 304b detect negative going R−, and positive going R+, crossings of the reference signal, R respectively. In the exemplary graphical illustration shown in FIG. 6, two positive crossings 600 and 604 are provided, as well as two negative crossings 602 and 606.

Count Between Positive Crossings function 304c controls the clock pulse inputs to Up/Down Numerator Counter 312d and to Denominator Counter 312e. When an OK to Count signal provided by Count Between Positive Crossings function 304c is high, the clock pulses to Up/Down Numerator Counter 312d and to Denominator Counter 312e are enabled, allowing them to count. Reset Logic function 304d allows the counters to be reset at predetermined intervals, for example, each successive R+, in preparation for the next counting cycle.

As such, Control Logic function 304 controls the counting of Up/Down Numerator Counter 312d and Denominator Counter 312e, whose ratio represents the raw phase (limited to ±180°) between the R and X signals. Control Logic function 304 also allows the counters to count (e.g., using clock pulses) between successive positive going R crossings (one period of the reference signal), and resets the counters at the end of each counting interval. For example, the clock pulse frequency may be much faster than the expected frequency of the reference signal, R. The faster the frequency is, the finer the phase resolution will be.

Figure 7:
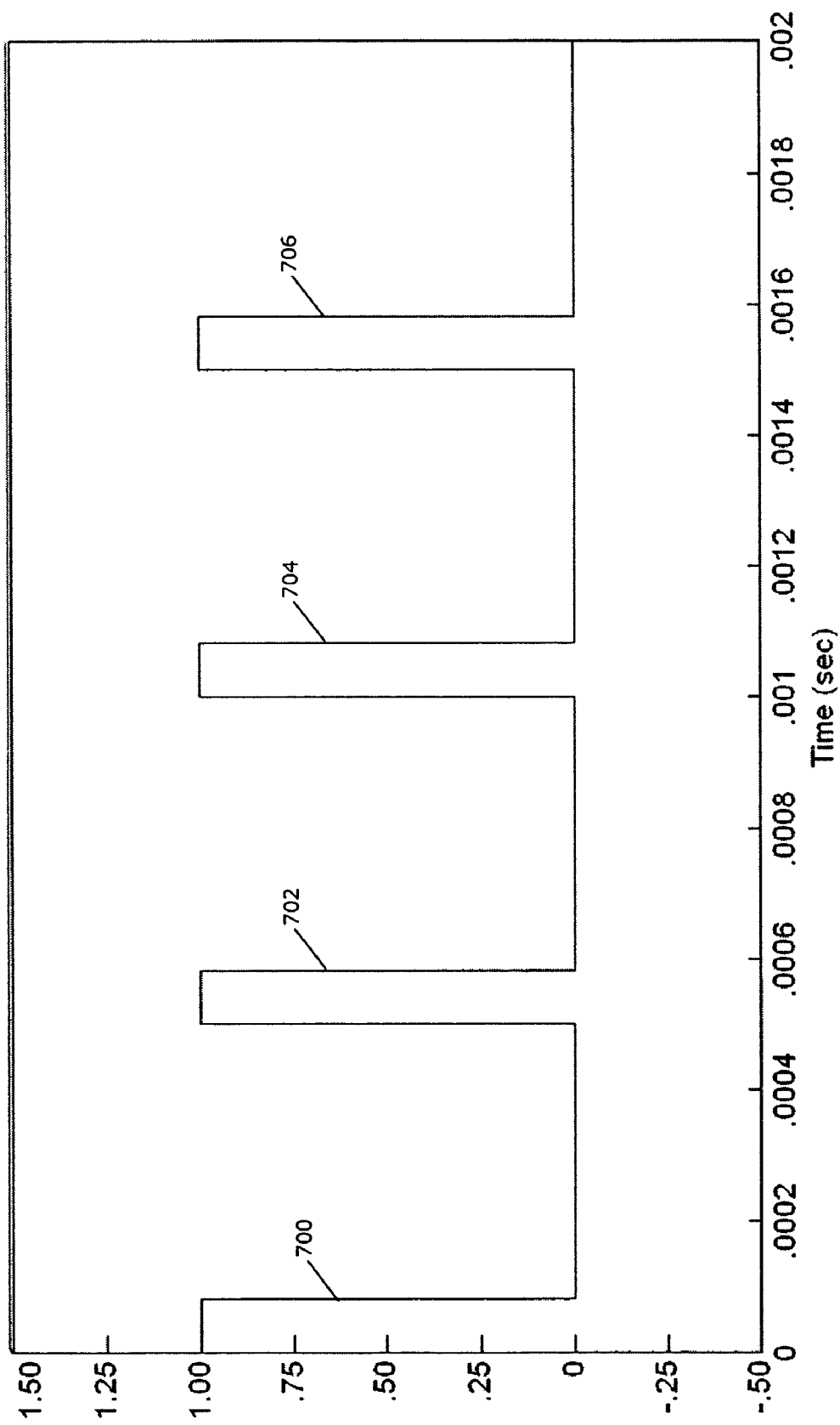
FIG. 7 is a graphical illustration related to yet another portion of a method of determining a phase between a first and a second signal in accordance with an exemplary embodiment of the present invention.

FIG. 7 is a graphical illustration of an exemplary output of Exclusive OR function 306 (XOR). Up/Down Numerator Counter 312d counts clock pulses when this signal is high (through AND function 312c), that is, during the time interval between an R zero crossing and an X zero crossing. This time interval represents the phase difference between the two signals R and X. XOR high is the interval when the clock pulses are counted to obtain the numerator count. In FIG. 7, XOR is high at intervals 700, 702, 704, and 706.

Figure 8:
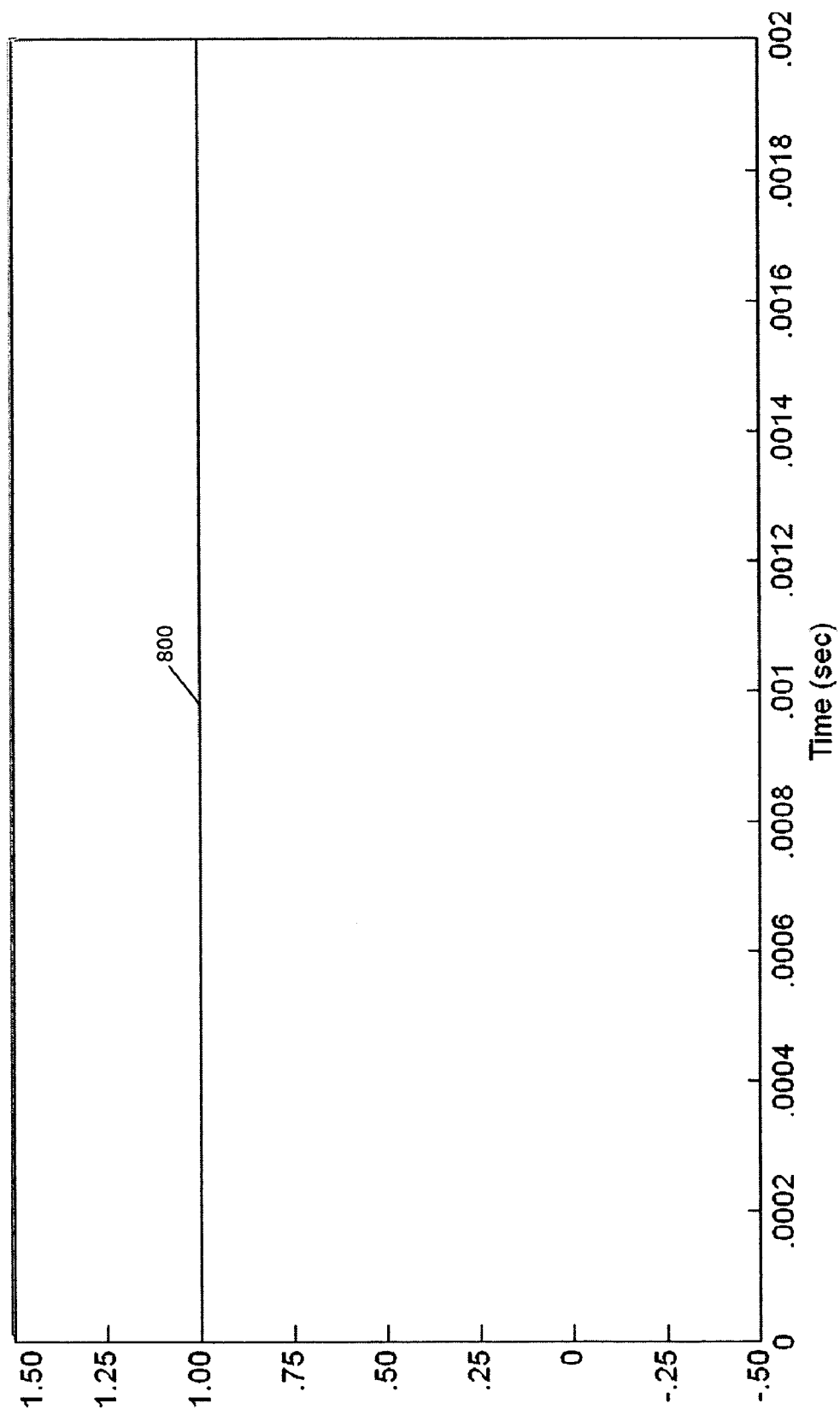
FIG. 8 is a graphical illustration related to yet another portion of a method of determining a phase between a first and a second signal in accordance with an exemplary embodiment of the present invention.

FIG. 8 is a graphical illustration related to an exemplary output of Determine Polarity function 308. Plot 800 illustrated in FIG. 8 indicates that the Polarity is positive (i.e., high or 1) for the signals in the present example. According to an exemplary embodiment of the present invention, Determine Polarity function 308 assigns a polarity at every R zero crossing (R+ and R−) according to the relationships below.

At R+
  if $X_{bi}$=Low, Polarity=pos
  if $X_{bi}$=High, Polarity=neg
At R−
  if $X_{bi}$=Low, Polarity=neg
  if $X_{bi}$=High, Polarity=pos According to these relationships, a positive zero crossing is assigned a positive value if $X_{bi}$ is negative or a negative value if $X_{bi}$ is positive, and a negative zero crossing is assigned a positive value if $X_{bi}$ is positive or a negative value if $X_{bi}$ is negative.

Figure 9:
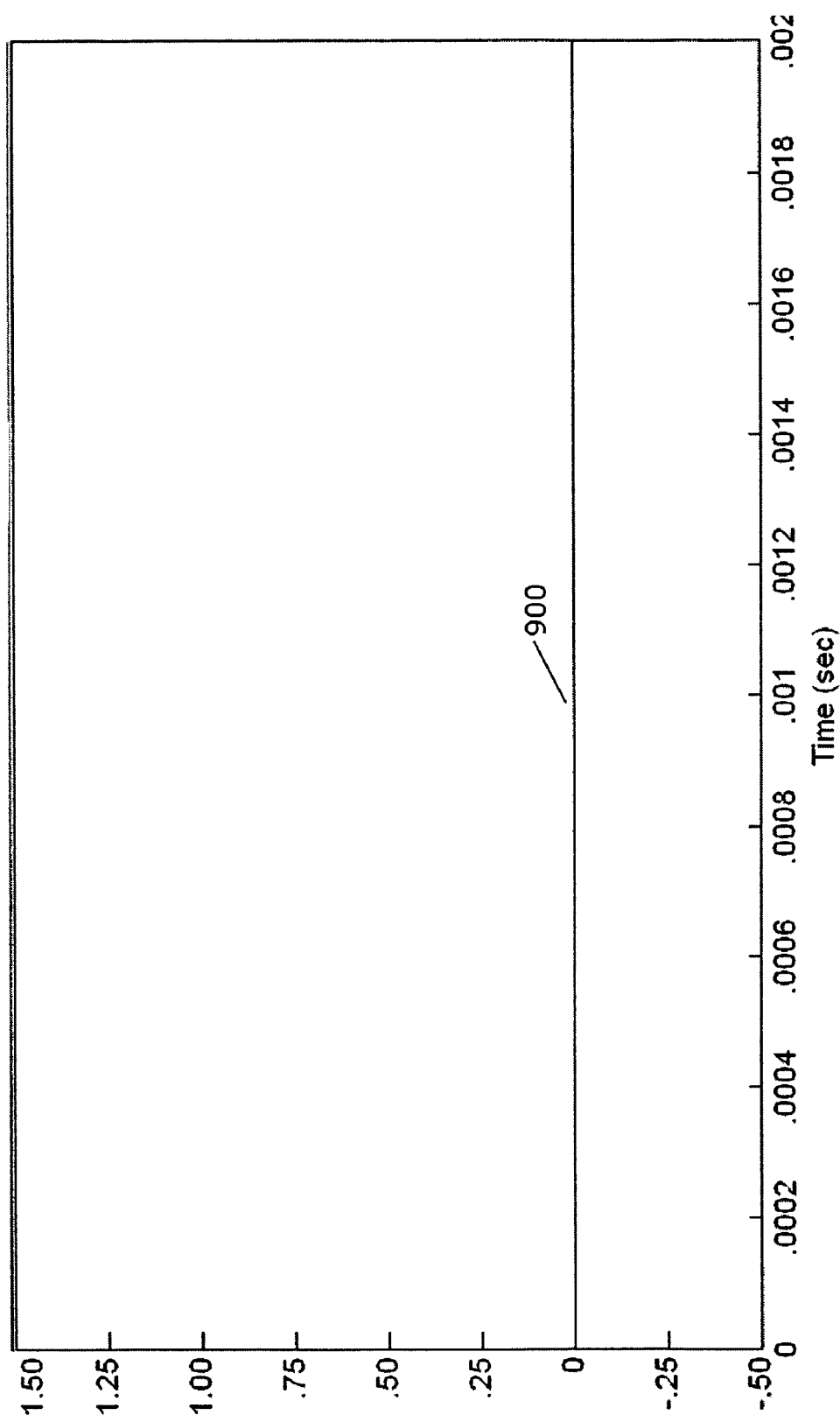
FIG. 9 is a graphical illustration related to yet another portion of a method of determining a phase between a first and a second signal in accordance with an exemplary embodiment of the present invention.

FIG. 9 is a graphical illustration related to an exemplary result of Up/Down Count Logic function 310. In conjunction with the polarity signal from Determine Polarity function 308 and the Porch Swing Direction input signal, Up/Down Count Logic function 310 determines whether Up/Down Numerator Counter 312d should count up or count down. According to an exemplary embodiment of the present invention, Up/Down Numerator Counter 312d is counted up in the case of phase lead, and Up/Down Numerator Counter 312d is counted down in the case of phase lag. Plot 900 illustrated in FIG. 9 indicates that the Up/Down signal is Down (low or 0) for the signals in the present example (i.e., the Porch Swing Direction is Forward (high or 1)).

According to an exemplary embodiment of the present invention, Up/Down Count Logic function 310 operates Up/Down Numerator Counter 312d according to the relationships below.

| | Polarity | |
|---|---|---|
| Direction | Neg | Pos |
| Fwd | Up | Down |
| Back | Down | Up |

According to these relationships, Up/Down Numerator Counter 312d is counted in a positive direction (i.e., counted up) if the moving device (e.g., a moving mirror) is moving in a first direction (e.g., Forward) and the value assigned to a corresponding zero crossing of the signal is negative or if the moving device (e.g., a moving mirror) is moving in a second direction (e.g., Back) and the value assigned to the corresponding zero crossing is positive. Up/Down Numerator Counter 312d is counted in a negative direction (i.e., counted down) if the moving device (e.g., a moving mirror) is moving in the first direction (e.g., Forward) and the value assigned to the corresponding zero crossing is positive or if the moving device (e.g., a moving mirror) is moving in the second direction (e.g., Back) and the value assigned to the corresponding zero crossing is negative. Of course, these directional and sign based relationships could be reversed.

As such, Up/Down Count Logic function 310 works with Determine Polarity function 308 to deal with phase lead and lag as well as the alternating sign of the phase induced by the change of Porch Swing direction. At each positive going R crossing and at each negative going R crossing, a positive or negative polarity is assigned. A positive polarity indicates a phase lead between R and X, and a negative polarity indicates a phase lag between R and X. The Up/Down count logic then accounts for the change in phase due to a change in Porch Swing Direction. For example a phase lead in the forward direction becomes a phase lag in the backward direction. But the physical angle of the Porch Swing has not changed. The change in sign due to direction is detected by the Up/Down Count Logic, which reverses the Up/Down Numerator Counter direction. Thus, as the Porch Swing changes direction the output of the Digital Angle Detector does not.

Figure 10:
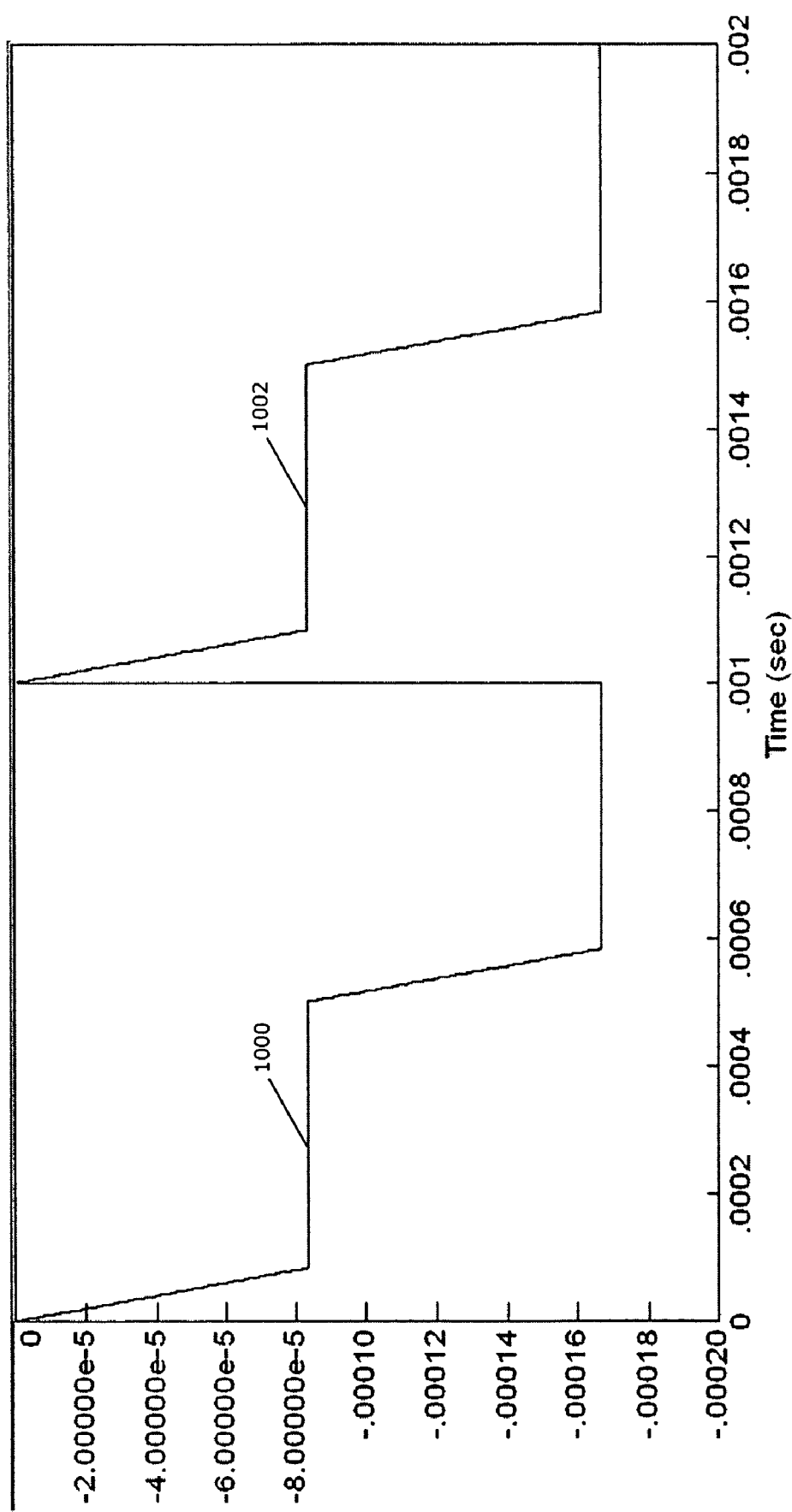
FIG. 10 is a graphical illustration related to yet another portion of a method of determining a phase between a first and a second signal in accordance with an exemplary embodiment of the present invention.

FIG. 10 is a graphical illustration related to an exemplary output of Up/Down Numerator Counter 312d. In FIG. 10, Up/Down Numerator Counter 312d counts down as controlled by the Up/Down signal illustrated in FIG. 9. A down count is consistent with the present example of a phase lag of −30° (see FIG. 1). Notice that the count down begins at time=0, a R+ crossing, and stops at time=0.001, the next R+ crossing. Up/Down Numerator Counter 312d only counts (e.g., clock pulses) when the XOR signal is high between successive R+ crossings. Two such successive crossings, related to plots 1000 and 1002, are represented in FIG. 10.

Figure 11:
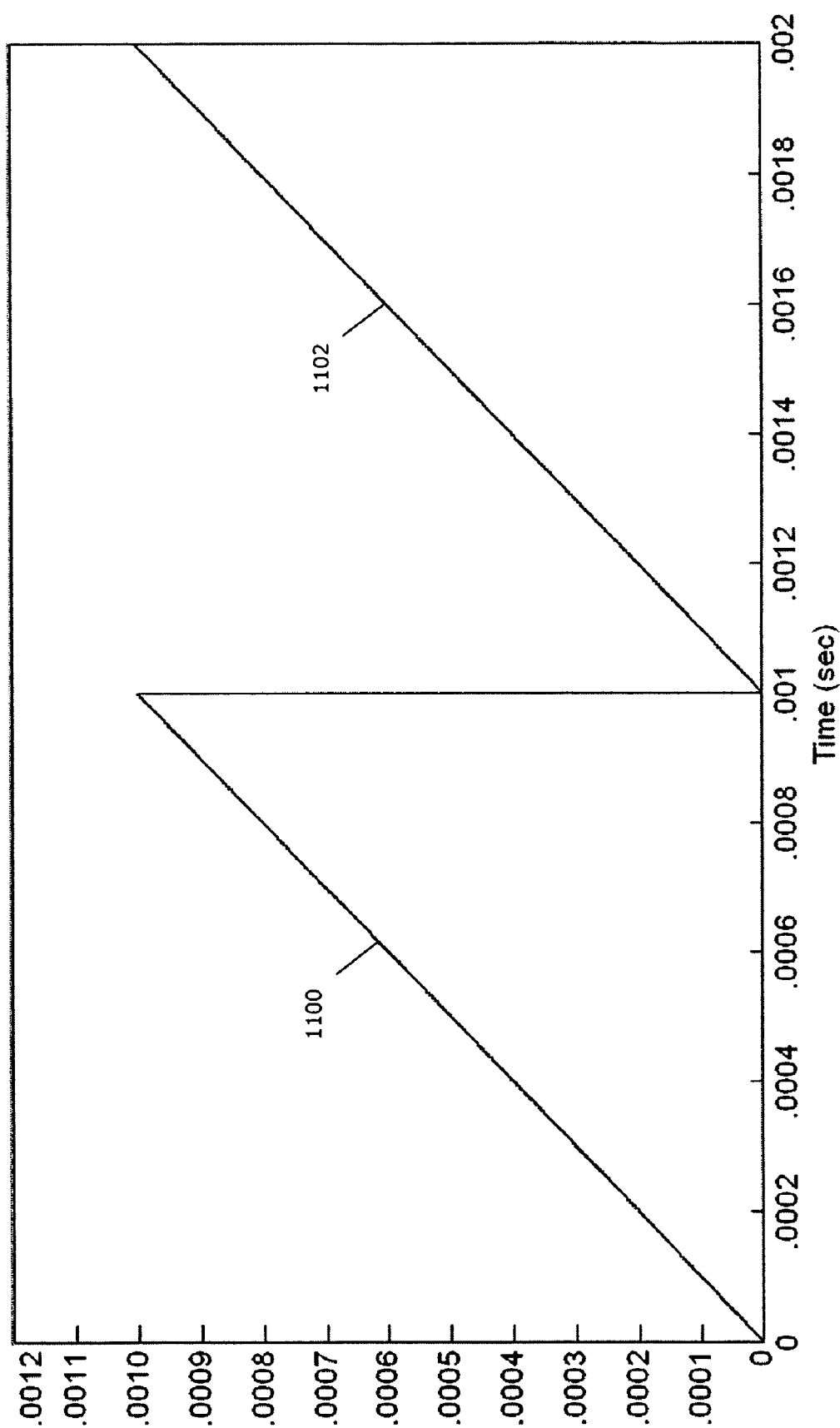
FIG. 11 is a graphical illustration related to yet another portion of a method of determining a phase between a first and a second signal in accordance with an exemplary embodiment of the present invention.

FIG. 11 is a graphical illustration related to an exemplary output of Denominator Counter 312e. Denominator Counter 312e counts (e.g., clock pulses) between successive R+ crossings. The final value of Denominator Counter 312e is the period of the input R sine wave. In FIG. 11, two plots 1100 and 1102 representing two counting cycles of Denominator Counter 312e are illustrated.

Calculate Raw Phase Angle function 312 latches (using Latch function 312f) the value of Up/Down Numerator Counter 312d and the value of Denominator Counter 312e, for example, every time a positive zero crossing, R+ of R occurs. At the end of each period of R, besides latching the values of the counters (via Latch function 312f), the counters are reset (via Reset Logic function 304d). At this event, the value of Up/Down Numerator Counter 312d is divided by the value of Denominator Counter 312e. The result lies between −1 and +1 and is scaled by 180°, providing an output (i.e., a Raw Phase angle) that lies between −180° and +180°. The output of Calculate Raw Phase Angle function 312 is provided to Unwrap Raw Phase Angle function 314.

Unwrap Raw Phase Angle function 314 appropriately adds or subtracts ±360° k. every time a significant jump in Raw Phase occurs, removing a ±180° phase limitation to the phase detector. More specifically, Unwrap Raw Phase Angle function 314 takes the Raw Phase Angle provided by Calculate Raw Phase Angle function 312 and, using a Phase Jump Threshold (using PJT Decision function 314b), determines if the raw phase angle has made a large change in value between subsequent time samples. If so, a counter is appropriately incremented or decremented at Raw Phase Angle+360° k function 314c, and 360° is added to or subtracted from the raw phase angle.

PJT Decision function 314b determines if the raw phase angle has made a large change in value between subsequent time samples using predetermined criteria for the PJT. For example, the predetermined value of the PJT is applied to the relationships below to determine if the counter is to be incremented or decremented.

If ΔPhase>PJT, then k=k+1
If ΔPhase<PJT, then k=k−1

Through the various embodiments of the present invention provided herein, deficiencies of prior phase detectors are overcome by a digital angle detector. The detector uses the known Porch Swing direction to control the calculation of phase (and, thus, Dynamic Alignment mechanism angle) such that the phase is independent of Porch Swing direction.

Figure 12:
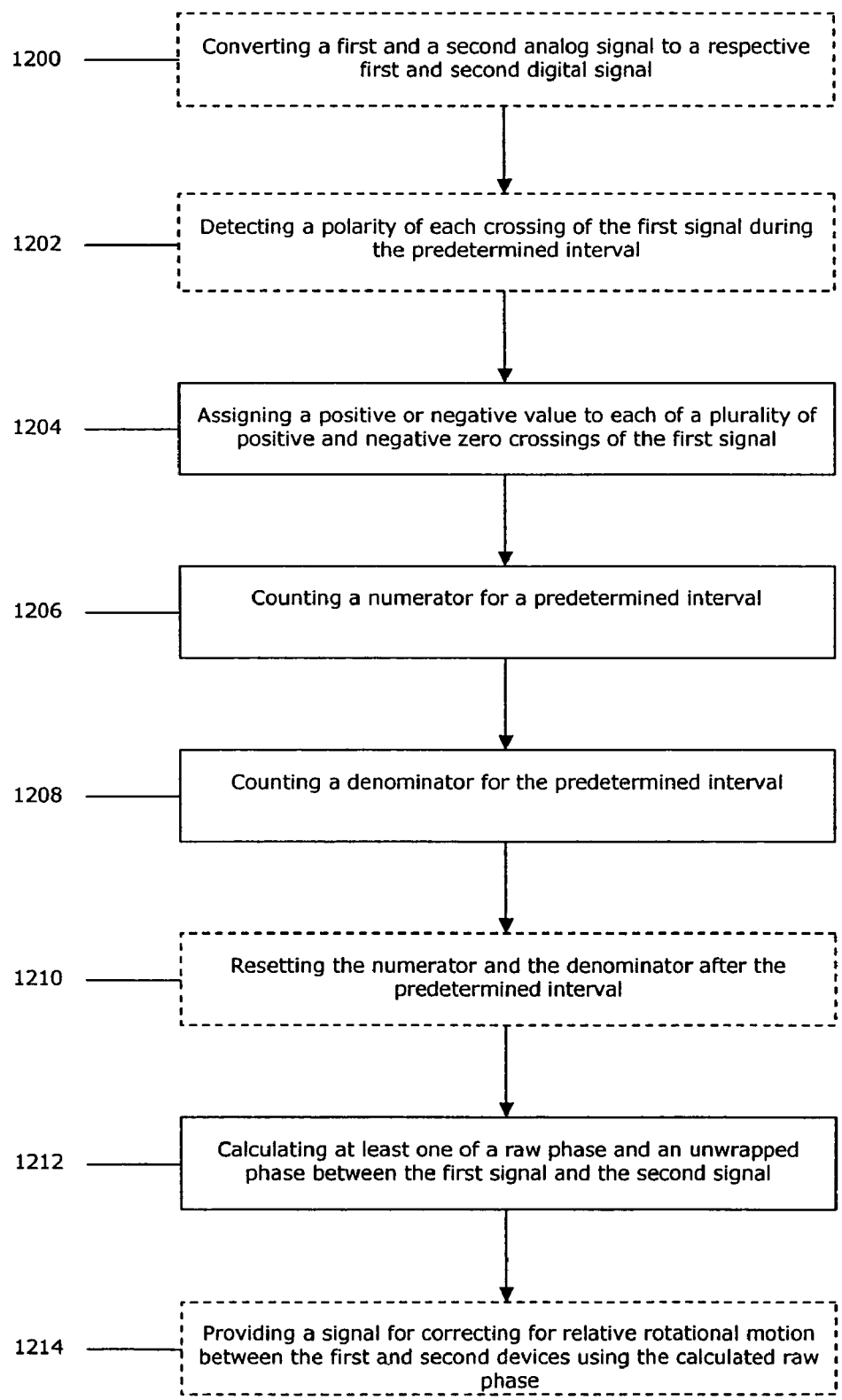
FIG. 12 is a flow diagram illustrating a method of determining a phase between a first and a second signal in accordance with an exemplary embodiment of the present invention.

FIG. 12 is a flow diagram illustrating a method of determining a phase between a first and a second signal. The first signal and the second signal correspond to signal transmissions between a first device and a second device. The second device periodically moves along a translational axis with respect to the first device in a first direction or a second direction. For example, the first device may be a stationary arm in an interferometer system, and the second device may be the moving arm (i.e., porch swing) of the interferometer system. At optional step 1200, a first and a second analog signal are converted to a first and second digital signal. At optional step 1202, a polarity of each zero crossing of the first digital signal is detected during a predetermined interval. At step 1204, a positive or negative value is assigned to each of a plurality of positive and negative zero crossings of the first signal. A positive zero crossing is assigned a positive value if the second signal is negative or a negative value if the second signal is positive. A negative zero crossing is assigned a positive value if the second signal is positive or a negative value if the second signal is negative. At step 1206, a numerator counter is operated for the predetermined interval. The numerator counter is counted in a positive direction if the second device is moving in the first direction and the value assigned to a corresponding zero crossing of the first signal is negative or if the second device is moving in the second direction and the value assigned to the corresponding zero crossing is positive. The numerator counter is counted in a negative direction if the second device is moving in the first direction and the value assigned to the corresponding zero crossing is positive or if the second device is moving in the second direction and the value assigned to the corresponding zero crossing is negative. At step 1208, a denominator counter is operated for the predetermined interval. The denominator counter is counted in a positive direction. At optional step 1210, the numerator and denominator counters are reset after the predetermined interval. At step 1212, a raw phase between the first signal and the second signal is calculated by dividing a value of the numerator counter by a corresponding value of the denominator counter after the predetermined interval. At optional step 1214, a signal is provided to correct for relative rotational motion between the first and second devices using the calculated raw phase.

Although the present invention has been described primarily by reference to interferometer systems, it is not limited thereto. The various exemplary embodiments of the present invention relate to a variety of applications, including, for example, communication systems including signals that do not periodically alternate the sign of the phase, but that hold the porch swing direction constant.

The present invention may be useful in providing a signal for correcting for relative rotational motion between the reference device and the moving device using a calculated raw phase value (e.g., having a range between −180° and +180°) or a calculated unwrapped phase value (e.g., having a range between −infinity and +infinity).

Although the present invention has been described primarily by reference to counters using clock pulses, it is not limited thereto. The counters described herein can operate in any of a number of manners so long as the frequency of the counting signals is sufficient to provide a meaningful Raw Phase value.

Although the present invention has been described primarily by reference to latching the counters at each period, it is not limited thereto. The counters may be latched at any of a number of predetermined intervals so long as enough time has passed so as to provide a meaningful Raw Phase value.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of determining a phase between a first signal and a second signal, the first signal and the second signal corresponding to signal transmissions between a first device and a second device, the second device periodically moving along a translational axis with respect to the first device in a first direction or a second direction, the method comprising the steps of:
- assigning a positive or negative value to each of a plurality of positive and negative zero crossings of the first signal, a positive zero crossing being assigned a positive value if the second signal is negative or a negative value if the second signal is positive, and a negative zero crossing being assigned a positive value if the second signal is positive or a negative value if the second signal is negative;
- counting a numerator for a predetermined interval, the numerator being counted in a positive direction if the second device is moving in the first direction and the value assigned to a corresponding zero crossing of the first signal is negative or if the second device is moving in the second direction and the value assigned to the corresponding zero crossing is positive, the numerator being counted in a negative direction if the second device is moving in the first direction and the value assigned to the corresponding zero crossing is positive or if the second device is moving in the second direction and the value assigned to the corresponding zero crossing is negative;
- counting a denominator for the predetermined interval, the denominator being counted in a positive direction; and
- calculating a raw phase between the first signal and the second signal by dividing a value of the numerator by a corresponding value of the denominator after the predetermined interval.

2. The method of claim 1 wherein said calculating step includes calculating a raw phase between the first signal and the second signal by dividing the value of the numerator by the value of the denominator at each positive crossing of the first signal.

3. The method of claim 1 further comprising the step of:
detecting a polarity of each crossing of the first signal during the predetermined interval.

4. The method of claim 1 wherein said counting a numerator step includes counting the numerator when either, but not both, of the first signal and the second signal has a positive value.

5. The method of claim 1 wherein the predetermined interval corresponds to an interval between positive zero crossings of the first signal.

6. The method of claim 1 wherein the translational motion of the second device with respect to the first device causes the phase between the first signal and the second signal to periodically alternate.

7. The method of claim 1 further comprising the step of:
providing a signal for correcting for relative rotational motion between the first and second devices using the calculated raw phase or a calculated unwrapped phase, the unwrapped phase being related to the calculated raw phase.

8. The method of claim 1 further comprising the step of:
converting a first and a second analog signal to the first and second signals respectively, the first and second signals being digital signals.

9. The method of claim 1 further comprising the step of:
resetting the numerator and the denominator after the predetermined interval.

10. The method of claim 1 wherein said calculating step includes repeatedly calculating the raw phase for each of a successive plurality of the predetermined interval.

11. The method of claim 10 wherein ±360° k. are added to the calculated raw phase if a difference between the raw phase calculated at successive predetermined intervals exceeds a predetermined value.

12. A digital phase detector for determining a phase between a first signal and a second signal, the first signal and the second signal corresponding to signal transmissions between a first device and a second device, the second device periodically moving along a translational axis with respect to the first device in a first direction or a second direction, said digital phase detector comprising:
- a polarity determiner for assigning a positive or negative value to each of a plurality of positive and negative zero crossings of the first signal, said polarity determiner assigning a positive zero crossing a positive value if the second signal is negative or a negative value if the second signal is positive, said polarity determiner assigning a negative zero crossing a positive value if the second signal is positive or a negative value if the second signal is negative;
- a numerator counter for counting for a predetermined interval, the numerator counter counting in a positive direction if the second device is moving in the first direction and the value assigned to a corresponding zero crossing of the first signal is negative or if the second device is moving in the second direction and the value assigned to the corresponding zero crossing is positive, the numerator counter counting in a negative direction if the second device is moving in the first direction and the value assigned to the corresponding zero crossing is positive or if the second device is moving in the second direction and the value assigned to the corresponding zero crossing is negative;
- a denominator counter for counting in a positive direction for the predetermined interval; and
- a raw phase calculator for calculating a raw phase between the first signal and the second signal by dividing a value of the numerator counter by a corresponding value of the denominator counter after the predetermined interval.

13. The digital phase detector of claim 12 wherein said raw phase calculator calculates the raw phase between the first signal and the second signal by dividing the value of the numerator counter by the value of the denominator counter at each positive crossing of the first signal.

14. The digital phase detector of claim 12 additionally comprising:
a zero crossing detector for detecting zero crossings of the first signal during the predetermined interval.

15. The digital phase detector of claim 12 wherein said numerator counter operates when either, but not both, of the first signal and the second signal has a positive value.

16. The digital phase detector of claim 12 wherein the predetermined interval corresponds to an interval between positive zero crossings of the first signal.

17. The digital phase detector of claim 12 wherein the translational motion of the second device with respect to the first device causes the phase between the first signal and the second signal to periodically alternate.

18. The digital phase detector of claim 12 wherein said raw phase value calculated by said raw phase calculator, or an unwrapped phase value calculated based on said raw phase value, is used to provide a signal for correcting for relative rotational motion between the first and second devices.

19. The digital phase detector of claim 12 additionally comprising:

a converter for converting a first and a second analog signal to the first and second signals respectively, the first and second signals being digital signals.

20. The digital phase detector of claim 12 wherein said numerator counter and said denominator counter are reset after the predetermined interval.

21. The digital phase detector of claim 12 wherein said raw phase calculator repeatedly calculates the raw phase for each of a successive plurality of the predetermined interval.

22. The digital phase detector of claim 21 additionally comprising:

a second raw phase calculator for adding ±360° k. to the calculated raw phase if a difference between the raw phase calculated at successive predetermined intervals exceeds a predetermined value.

* * * * *

UNITED STATES PATENT AND TRADEMARK OFFICE
CERTIFICATE OF CORRECTION

| | | |
|---|---|---|
| PATENT NO. | : 7,218,697 B2 | Page 1 of 1 |
| APPLICATION NO. | : 10/721942 | |
| DATED | : May 15, 2007 | |
| INVENTOR(S) | : Robert H. Josselson, Lester G. Matheson and David G. Cordray | |

It is certified that error appears in the above-identified patent and that said Letters Patent is hereby corrected as shown below:

Column 6, lines 40, 41, and 43 and column 9, lines 34, 40, 42, and 43, please amend each instance of "PIT" to read --PJT--

Signed and Sealed this

Eighteenth Day of September, 2007

JON W. DUDAS
*Director of the United States Patent and Trademark Office*